(12) United States Patent
Friedmann et al.

(10) Patent No.: US 7,887,875 B2
(45) Date of Patent: Feb. 15, 2011

(54) METHOD TO REDUCE PHOTORESIST POISONING

(75) Inventors: James B. Friedmann, Dallas, TX (US); Shangting Detweiler, Dallas, TX (US); Brian M. Trentman, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 843 days.

(21) Appl. No.: 10/262,470

(22) Filed: Sep. 30, 2002

(65) Prior Publication Data
US 2004/0062867 A1    Apr. 1, 2004

(51) Int. Cl.
B05D 5/12     (2006.01)
C23C 16/24    (2006.01)
H01L 21/4763  (2006.01)

(52) U.S. Cl. ............. 427/58; 427/255.18; 427/255.393; 427/255.394; 438/636

(58) Field of Classification Search .................... 427/58, 427/96, 282, 255.18, 255.393, 255.394; 438/636
See application file for complete search history.

(56) References Cited

U.S. PATENT DOCUMENTS

| 5,219,788 | A  | * | 6/1993 | Abernathey et al. | ......... 438/636 |
| 5,486,267 | A  | * | 1/1996 | Knight et al. | ................ 438/694 |
| 5,539,249 | A  | * | 7/1996 | Roman et al. | ................ 257/649 |
| 5,710,067 | A  | * | 1/1998 | Foote et al. | .................. 438/636 |
| 6,051,282 | A  | * | 4/2000 | Konjuh et al. | ................ 427/539 |
| 6,103,456 | A  | * | 8/2000 | Tobben et al. | ................ 430/317 |
| 6,242,361 | B1 | * | 6/2001 | Lee et al. | ..................... 438/710 |
| 6,395,644 | B1 | * | 5/2002 | Hopper et al. | .............. 438/738 |
| 6,534,397 | B1 | * | 3/2003 | Okada et al. | ................. 438/633 |
| 6,627,387 | B2 | * | 9/2003 | Hsieh et al. | .................. 430/313 |
| 6,686,272 | B1 | * | 2/2004 | Lee et al. | ..................... 438/636 |
| 6,713,386 | B1 | * | 3/2004 | Hu et al. | ...................... 438/639 |
| 6,784,094 | B2 | * | 8/2004 | Yin et al. | ..................... 438/636 |
| 6,903,007 | B1 | * | 6/2005 | Foote et al. | .................. 438/636 |
| 2002/0047202 | A1 | * | 4/2002 | Moore et al. | ................. 257/751 |
| 2002/0076843 | A1 | * | 6/2002 | Ruelke et al. | .................. 438/29 |
| 2003/0124818 | A1 | * | 7/2003 | Luo et al. | .................... 438/482 |
| 2005/0118541 | A1 | * | 6/2005 | Ahn et al. | .................... 430/464 |

* cited by examiner

Primary Examiner—Brian K Talbot
(74) Attorney, Agent, or Firm—Wade J. Brady, III; Frederick J. Telecky, Jr.

(57) ABSTRACT

A silicon rich anti-reflective coating (30) is formed on a layer (10) in which narrow linewidth features are to be formed. Prior to the formation of a photoresist layer (50), the anti-reflecting coating (30) is exposed to excited oxygen species to reduce photoresist poisoning.

9 Claims, 2 Drawing Sheets

METHOD TO REDUCE PHOTORESIST POISONING

FIELD OF THE INVENTION

The present invention relates to semiconductor manufacturing and in particular to a method for reducing the effects of photoresist poisoning from anti-reflective coating (ARC) layers.

BACKGROUND OF THE INVENTION

In the manufacture of integrated circuits, the various layers which form the integrated circuit are patterned using photolithography. In the photolithography process a layer of photosensitive material called photoresist is first formed on the surface of the layer to be patterned. A pattern is then transferred to the photoresist from a photomask. The photomask typically comprises a glass slide on which an opaque pattern has been formed. By positioning the photomask over the surface of the photoresist and exposing the photomask to UV radiation, the opaque pattern on the photomask will be transferred to the photoresist. Exposing the photoresist to light will change the molecular structure of the material and allow certain regions of the photoresist to be removed. If positive photoresist is used then the regions exposed to the UV radiation will be removed. If negative photoresist is used then the regions of the photoresist which were not exposed to the UV radiation will be removed. Removal of these various regions of the photoresist allows the pattern in the photoresist to be transferred to the underlying layers.

The minimum pattern linewidth which can be formed in the photoresist is dependent on a number of factors including the wavelength of the radiation used to expose the photoresist as well as the formation of standing waves in the photoresist layer during the exposure. For a given radiation wavelength the presence of standing waves in the photoresist layer will severely limit the minimum pattern linewidth which can be formed. Standing waves are formed in the photoresist by reflection of the incident radiation from the upper and lower surfaces of the photoresist layer. To reduce the standing waves formed in the photoresist layer an anti-reflective coating (ARC) layer is often placed between the layer to be patterned and the photoresist layer. Such an arrangement is shown in FIG. 1(a). An anti-reflective coating (ARC) layer 20 is formed on the layer to be patterned 10. In semiconductor processing the layer 10 can comprise silicon, polycrystalline silicon, dielectric layers such as silicon oxide and silicon, metal, or any material which may be used in fabricating the integrated circuit. A number of materials have been used to form the ARC layer including polymers and silicon nitride. For the very narrow line widths required in modern integrated circuits it is preferable to use silicon nitride to form the ARC layer 20. For the case where the ARC layer 20 comprises silicon nitride, the pattern is first transferred to the photoresist film 30 using the method described above. The patterned photoresist film is then used as a masking layer to transfer the pattern to the ARC layer 20 and the layer to be patterned 10. For the case of patterned lines, an example of a patterned photoresist layer is shown in FIG. 1(b) where the patterned photoresist lines 35 are shown. The patterned photoresist lines 31 shown in FIG. 1(b) are flared at the base of the lines. This flaring will limit the shape of the profiles of the patterned transferred to the ARC layer 20 and the layer to be patterned 10 and will also affect the minimum line width and line width uniformity that can be obtained from a particular technology. In the case of silicon nitride ARC layers the flaring is due to the poisoning of the photoresist film 30 by the silicon nitride ARC layer 20. In order to reduce and/or eliminate the flaring of the photoresist lines 35 the photoresist poisoning effect has to be reduced and/or eliminated. There is therefore a great need for a method that reduces and/or eliminates photoresist poisoning when using silicon nitride and other related ARC layers.

SUMMARY OF THE INVENTION

The instant invention is a method for forming narrow features (<0.2 um) in the manufacture of semiconductor integrated circuits. The method comprises forming a silicon rich anti-reflective coating layer on the layer to be patterned. The surface of the silicon rich anti-reflective coating is then exposed to excited oxygen species. Following the exposure, a photoresist layer is formed on the anti-reflective coating. The pattern in the photoresist is formed using standard processing techniques. The patterned photoresist is then used to pattern the layer in the semiconductor circuit.

DETAILED DESCRIPTION OF THE INVENTION

The formation of very narrow features (<0.2 mm) requires the use of an ARC layer as described above. Silicon nitride is finding increasing usage as an ARC layer due to its favorable optical properties. However as described above silicon nitride will poison the photoresist resulting in distortions in the desired profiles. The instant invention is a method for reducing and/or eliminating photoresist poisoning.

Figure 1A:
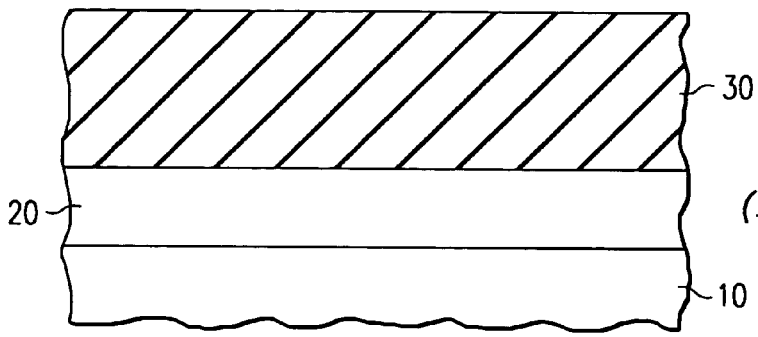
FIGS. 1(a) and (b) are cross section drawings showing narrow line features formed according to the prior art
Figure 1B:
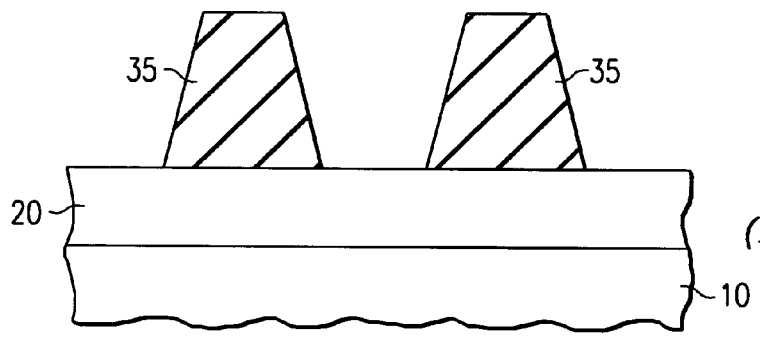
Figure 2A:
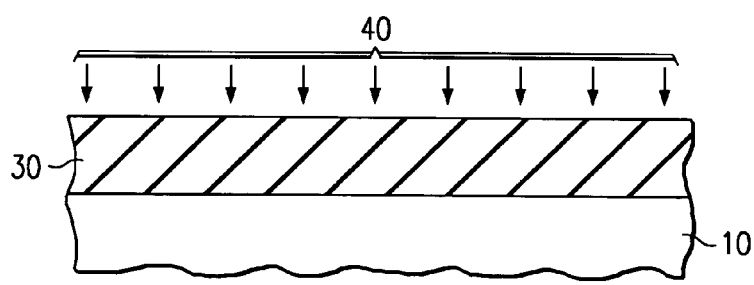
FIGS. 2(a)-2(d) are cross section drawings showing narrow line features formed according to an embodiment of the instant invention.
Figure 2B:
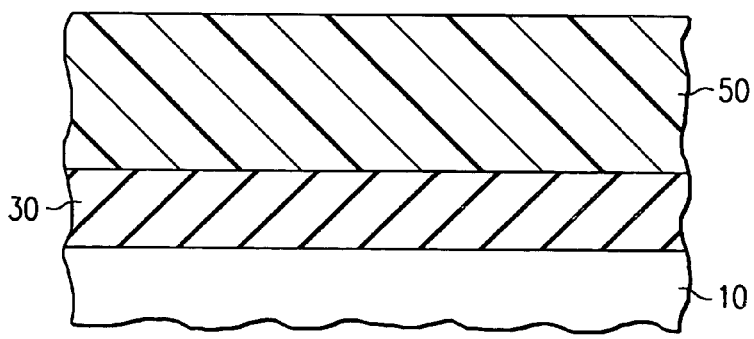
Figure 2C:
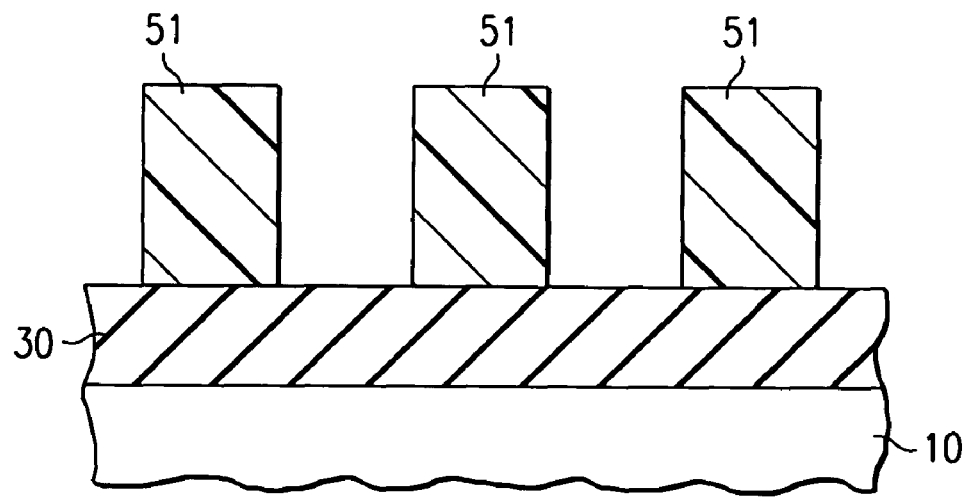
Figure 2D:
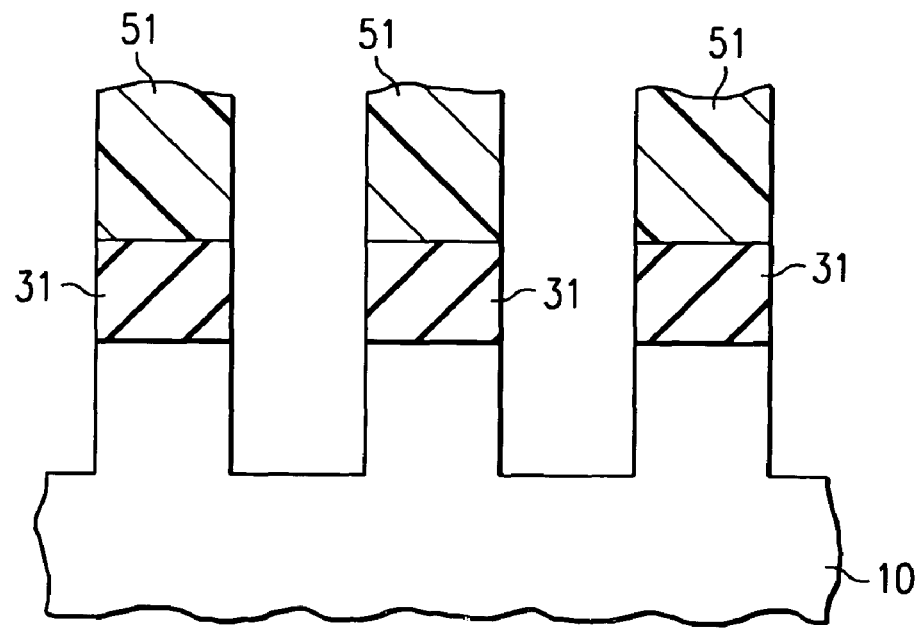

Shown in FIG. 2(a) is an ARC layer 30 formed on an integrated circuit layer 10 according to an embodiment of the instant invention. The ARC layer 30 is formed using an inorganic material. In an embodiment on the instant invention the ARC layer comprises a silicon-rich (SR) silicon nitride layer 30. The SR silicon nitride layer can be formed using a two-step deposition and surface passivation process. The deposition process forms a silicon nitride layer and comprises placing the wafer containing the layer 10 into a deposition chamber and flowing $SiH_4$, $NH_3$, and He into the chamber at flow rates of 75 sccm to 125 sccm, 180 sccm to 250 sccm, and 700 sccm to 2500 sccm respectively. During the deposition process the wafer temperature is kept at temperatures between 280° C. to 350° C. Following the deposition step, a surface passivation step is performed on the silicon nitride layer. The surface passivation comprises placing the silicon nitride layer in a reaction chamber and flowing $O_2$ or $N_2O$ gas into the reaction chamber at flow rates between 1000 sccm and 5000 sccm with the wafer temperature kept between 200° C. and 375° C. The surface passivation process modifies the upper surface of the silicon nitride layer. Following the formation of the SR silicon nitride ARC layer 30, the surface of the ARC layer 30 is exposed to excited oxygen species 40 such as ions, radicals, atoms, and/or molecules in a oxygen treatment step. In general excited oxygen species have greater potential energies than ground state oxygen species. In some excited oxygen species the electrons which comprise such species occupy higher energy levels compared to the ground state of such species. In other instances the excited oxygen species will be ionized. The excited oxygen species will modify the surface of the ARC layer 30 reducing and/or eliminating photoresist poisoning. In an embodiment of the instant invention the excited oxygen species are produced in a downstream plasma process using the following four steps:

|  | Step 1 | Step 2 | Step 3 | Step 4 |
| --- | --- | --- | --- | --- |
| RF Time (sec) | 0 | 2-6 | 90-300 | 0 |
| RF power (W) | 0 | 700-950 | 750-1200 | 0 |
| Pressure (T) | 6 | 0.5-2 | 0.5-2 | 6 |
| $O_2$ flow (sccm) | 5000 | 1000 | 3000 | 5000 |
| Wafer temp. (° C.) | 200-375 | 200-375 | 200-375 | 200-375 |

In addition to the downstream plasma process any process capable of producing excited oxygen species can be used in the instant invention. Following the treatment of the surface of the ARC layer 30 with excited oxygen species 40, a photoresist layer 50 is formed on the surface of the ARC layer 30 as shown in FIG. 2(*b*).

As shown in FIG. 2(*c*), the photoresist layer 51 is patterned using standard photolithography. This comprises exposing the resist layer 51 to UV radiation through a photomask and removing the exposed or unexposed regions of the photoresist layer 51. The patterned photoresist layer is then used as a mask to pattern the ARC layer 31 and the integrated circuit layer 10. This is shown in FIG. 2(*d*). The integrated circuit layer 10 can be any layer used in the formation of the integrated circuit including silicon, polycrystalline silicon, silicon oxide, silicon nitride, metal, or any suitable material. The invention is not limited to the pattern illustrated in FIGS. 2(*a*)-2(*d*). Any suitable pattern used in the manufacture of an integrated circuit can be formed using the methodology of the instant invention.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method to reduce photoresist poisoning, comprising:
   providing a first layer to be patterned;
   forming a silicon rich silicon nitride anti-reflective coating layer on said first layer;
   passivating an upper surface of said silicon rich silicon nitride anti-reflective coating layer using a gas mixture comprising $N_2O$ and at a temperature between 200° C. and 375° C.;
   exposing the passivated silicon rich anti-reflective coating layer to excited oxygen species wherein said excited oxygen species are produced using a downstream plasma process;
   forming a photoresist layer on said anti-reflective coating layer; and
   patterning said photoresist layer.

2. The method of claim 1 wherein said downstream plasma process is conducted at an RF power ranging from 700 watts to 1200 watts.

3. The method of claim 1 wherein said silicon rich silicon nitride layer is formed by a method comprising flowing $SiH_4$, $NH_3$, and He into a deposition chamber using a deposition temperature between 280° C. and 350°.

4. A method to reduce photoresist poisoning, comprising:
   providing a first layer to be patterned;
   forming a silicon rich silicon nitride anti-reflective coating layer on said first layer by a method comprising flowing $SiH_4$ and $NH_3$ into a deposition chamber;
   passivating an upper surface of said silicon rich silicon nitride anti-reflective coating layer using a gas mixture comprising $N_2O$;
   exposing the passivated silicon rich anti-reflective coating layer to excited oxygen species wherein said excited oxygen species are produced using $O_2$ in a downstream plasma process, wherein said downstream plasma process is conducted at an RF power ranging from 700 watts to 1200 watts;
   forming a photoresist layer on said anti-reflective coating layer; and
   patterning said photoresist layer.

5. A method to reduce photoresist poisoning, comprising:
   providing a first layer to be patterned;
   forming a silicon rich silicon nitride anti-reflective coating layer on said first layer, wherein forming the silicon rich silicon nitride layer comprises using $SiH_4$ and $NH_3$ as reaction gases;
   passivating an upper surface of said silicon rich silicon nitride anti-reflective coating layer using a gas mixture comprising $N_2O$;
   exposing the passivated silicon rich anti-reflective coating layer to excited oxygen species;
   forming a photoresist layer on said anti-reflective coating layer; and
   patterning said photoresist layer.

6. The method of claim 5 wherein forming the silicon rich silicon nitride layer further comprises flowing He and the $SiH_4$ and $NH_3$ reaction gases into a deposition chamber using a deposition temperature between 280° C. and 350°.

7. The method of claim 5 wherein the excited oxygen species are produced using a downstream plasma process.

8. The method of claim 7 wherein the downstream plasma process is conducted at an RF power ranging from 700 watts to 1200 watts.

9. The method of claim 5 wherein the excited oxygen species are produced using $O_2$.

* * * * *